United States Patent
Yu et al.

(10) Patent No.: US 7,382,617 B2
(45) Date of Patent: Jun. 3, 2008

(54) HEAT SINK ASSEMBLY

(75) Inventors: Chun-Huang Yu, Changhua County (TW); Ren-Hung Huang, Hualien (TW)

(73) Assignee: Nanya Technology Corporation, Taoyuan (TW)

( * ) Notice: Subject to any disclaimer, the term of this patent is extended or adjusted under 35 U.S.C. 154(b) by 14 days.

(21) Appl. No.: 11/523,902

(22) Filed: Sep. 19, 2006

(65) Prior Publication Data

US 2007/0165382 A1    Jul. 19, 2007

(30) Foreign Application Priority Data

Jan. 16, 2006    (TW) ............... 95101600 A

(51) Int. Cl.
*H05K 7/20* (2006.01)
*F28F 7/00* (2006.01)
*H01L 23/34* (2006.01)

(52) U.S. Cl. ............... 361/704; 165/80.2; 165/80.3; 165/185; 257/719

(58) Field of Classification Search ............ None
See application file for complete search history.

(56) References Cited

U.S. PATENT DOCUMENTS

| | | | | |
|---|---|---|---|---|
| 5,109,318 A | * | 4/1992 | Funari et al. | 361/710 |
| 6,233,150 B1 | * | 5/2001 | Lin et al. | 361/704 |
| 6,297,966 B1 | * | 10/2001 | Lee et al. | 361/799 |
| 6,353,538 B1 | * | 3/2002 | Ali et al. | 361/728 |
| 6,483,702 B1 | * | 11/2002 | Lofland | 361/704 |
| 7,190,595 B2 | * | 3/2007 | Chang | 361/816 |
| 7,215,551 B2 | * | 5/2007 | Wang et al. | 361/707 |
| 7,221,569 B2 | * | 5/2007 | Tsai | 361/704 |
| RE39,784 E | * | 8/2007 | Hsueh | 361/697 |
| 2004/0130873 A1 | * | 7/2004 | Hsueh | 361/697 |
| 2007/0223198 A1 | * | 9/2007 | Lai et al. | 361/720 |

* cited by examiner

*Primary Examiner*—Gregory D Thompson
(74) *Attorney, Agent, or Firm*—Quintero Law Office

(57) ABSTRACT

A heat sink assembly for dissipating heat from a fully buffered dual inline memory module includes a first heat-dissipating sheet, a second heat-dissipating sheet and at least one clip. The first heat-dissipating sheet covers the fully buffered dual inline memory module. The clip holds the first heat-dissipating sheet and the second heat-dissipating sheet between which the fully buffered dual inline memory module is sandwiched.

20 Claims, 6 Drawing Sheets

HEAT SINK ASSEMBLY

BACKGROUND OF THE INVENTION

1. Field of the Invention

The invention relates to a heat sink assembly providing highly efficient heat dissipation at low cost, and with good mechanical strength.

2. Description of the Related Art

Unlike normal dual inline memory modules (DIMMs) which are connected in parallel to a memory controller, fully buffered dual inline memory modules (FBDIMMs) are connected in a point-to-point serial architecture. FIG. 1A depicts the front surface of an FBDIMM, and FIG. 1B depicts the back surface of the FBDIMM. An FBDIMM 10 is characterized by an advanced memory buffer (AMB) chip 110 on its front surface. The AMB chip 110 collects and distributes the data from or to the memory chips (i.e. dynamic random access memories, DRAMs) 120 on the FBDIMM 10, buffers and forwards the data to the next FBDIMM or memory controller.

During operation, the AMB chip 110 generates a large quantity of heat. To prevent the AMB chip 110 from failing due to high temperature, a heat sink (not shown) is fastened on the AMB chip 110 via a metallic spring (not shown), absorbing heat from the AMB chip 110 by thermal conduction and then dissipating the heat.

The conventional heat sink presents the following drawbacks. The heat sink is slightly larger than the AMB chip 110 in area, thus, heat-dissipation efficiency is poor. Moreover, the heat sink is made of copper which is expensive. Furthermore, the heat sink cannot enhance the mechanical strength of the FBDIMM 10 to meet requirement in the three-point-bending test.

BRIEF SUMMARY OF THE INVENTION

A heat sink assembly for dissipating heat from a fully buffered dual inline memory module (FBDIMM) is provided. The heat sink assembly includes a first heat-dissipating sheet, a second heat-dissipating sheet and at least one clip. The FBDIMM is sandwiched in between the first heat-dissipating sheet and the second heat-dissipating sheet by the clip fix the heat sink assembly.

The first and second heat-dissipating sheets cover the FBDIMM. It is therefore understood that the first heat-dissipating sheet and the second heat-dissipating sheet of the invention are much larger than the conventional heat sink. Thus, the first heat-dissipating sheet and the second heat-dissipating sheet provide excellent heat dissipation and can be made of inexpensive metal (e.g. aluminum).

Furthermore, a plurality of embossed strips are formed on the first and second heat-dissipating sheets, and extend in different directions. One of the embossed strips longitudinally extends along a lengthwise direction of the second heat-dissipating sheet, providing the heat sink assembly for sufficient mechanical strength to pass the three-point-bending test.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
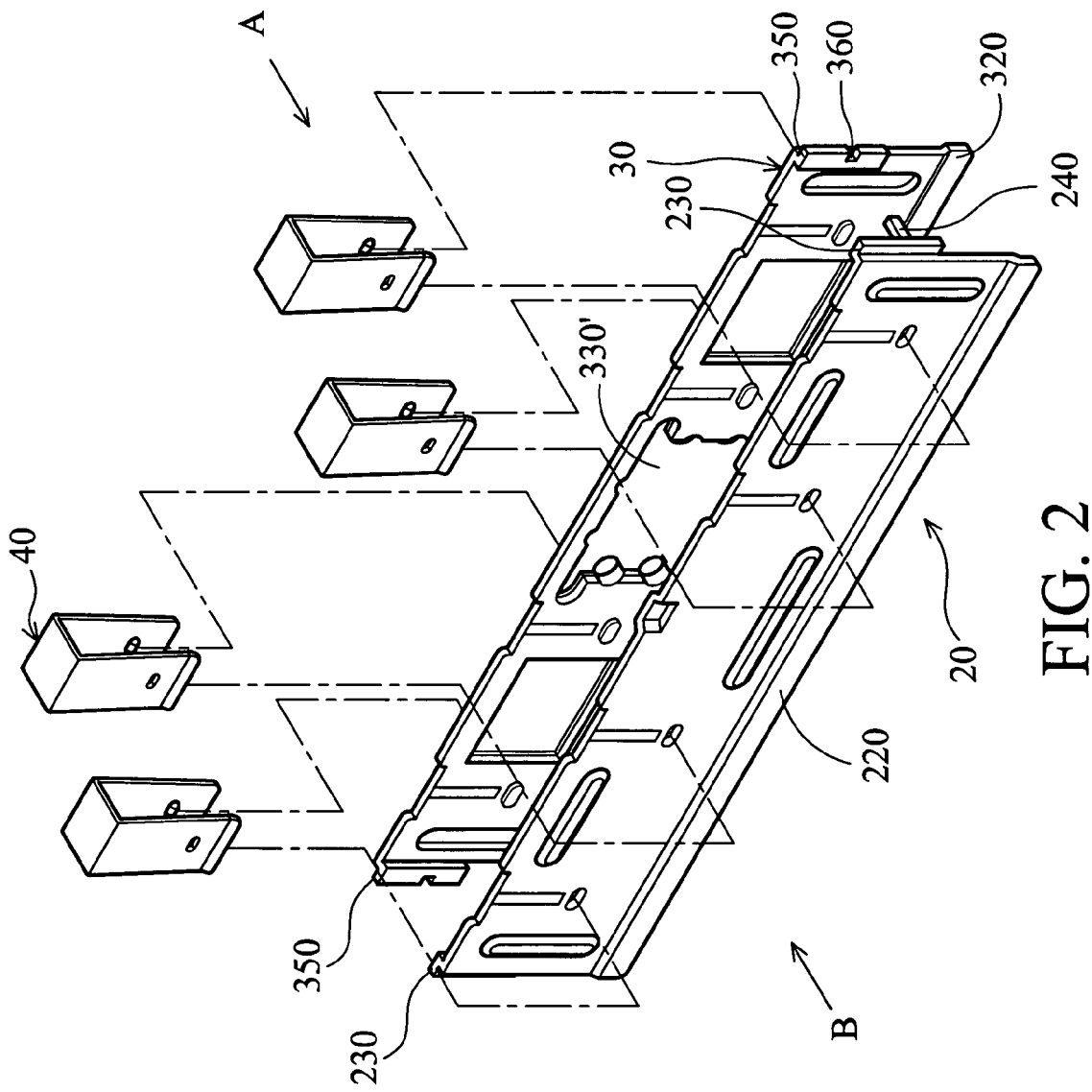
FIG. 2 is an exploded diagram of a heat sink assembly in accordance with the invention.

Referring to FIG. 2, a heat sink assembly of an embodiment of the invention includes a first heat-dissipating sheet 30, a second heat-dissipating sheet 20, and a plurality of clips 40. The above-mentioned FBDIMM 10 is sandwiched between the first heat-dissipating sheet 30 and the second heat-dissipating sheet 20, and fixed by the clips 40 (hereafter the entire assembly is referred to "the assembly"). It is noted that the first heat-dissipating sheet 30 and the second heat-dissipating sheet 20 of this embodiment cover the FBDIMM 10. It is therefore understood that the first heat-dissipating sheet 30 and the second heat-dissipating sheet 20 of the invention are much larger than the conventional heat sink. Thus, the first heat-dissipating sheet 30 and the second heat-dissipating sheet 20 provide excellent heat dissipation and can be made of inexpensive metal (e.g. aluminum).

Figure 1A:
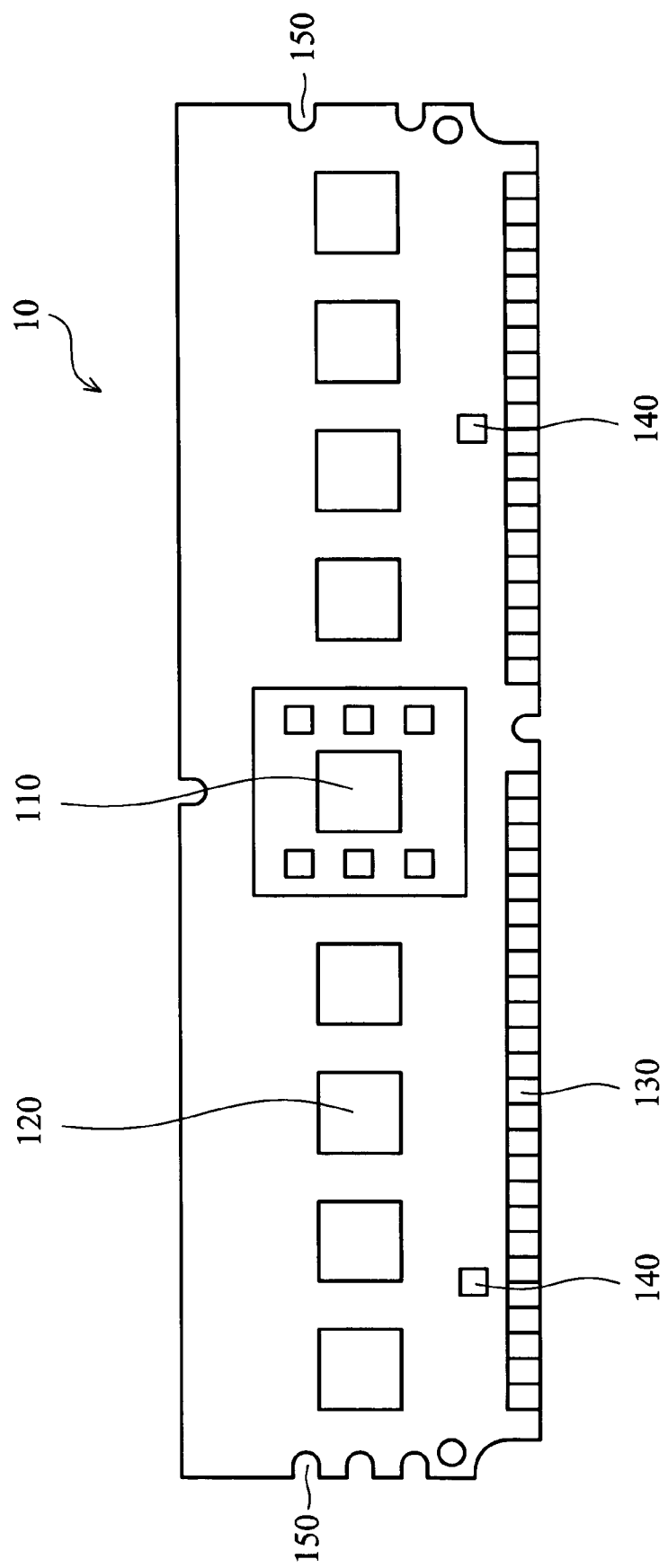
FIG. 1A depicts the front surface of an FBDIMM.
Figure 1B:
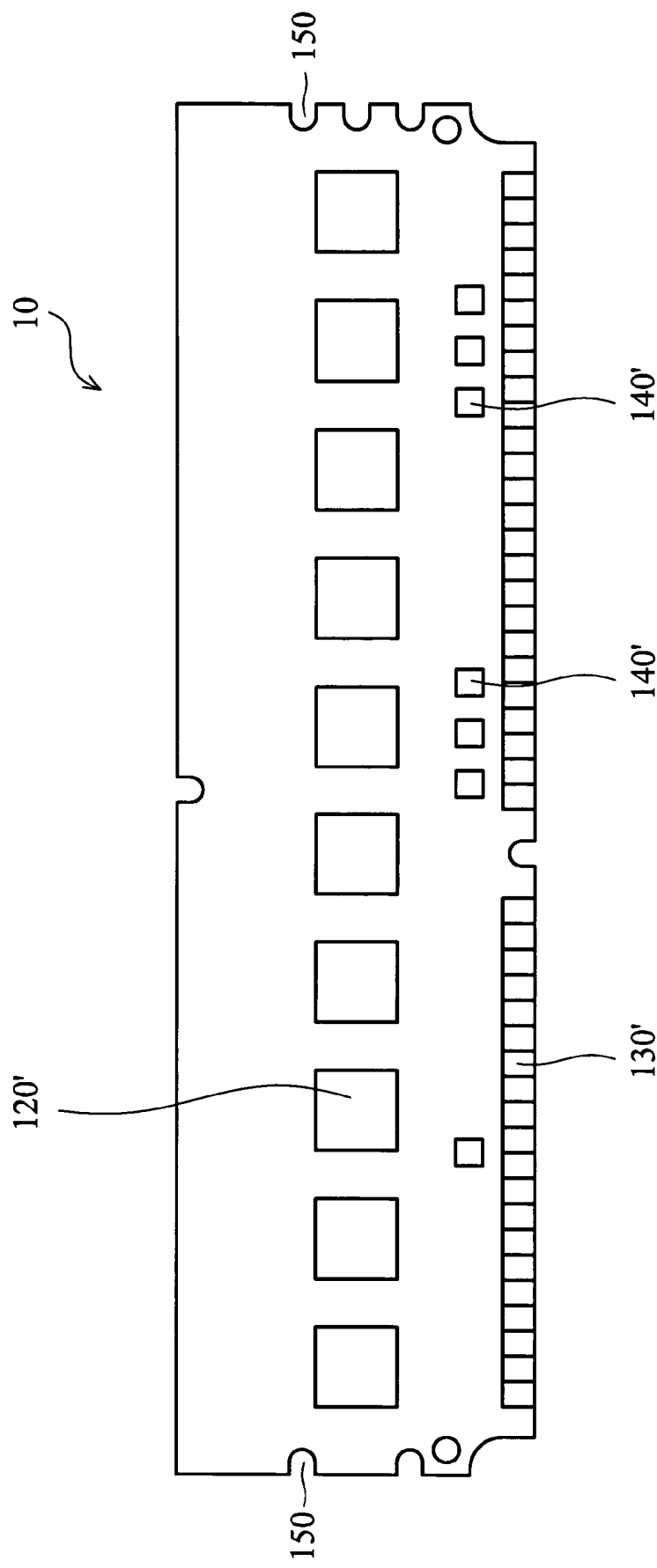
FIG. 1B depicts the back surface of the FBDIMM.

In the assembly, the front surface of the FBDIMM 10 (FIG. 1A) faces the first heat-dissipating sheet 30. The first heat-dissipating sheet 30 attaches to the AMB chip 110, allowing heat transmitting from the AMB chip 110 to the first heat-dissipating sheet 30. Furthermore, the first heat-dissipating sheet 30 is spaced apart from all the memory chips 120 on the front surface of the FBDIMM 10, preventing heat transmission from the AMB chip 110 through the first heat-dissipating sheet 30 to the memory chips 120. The back surface of the FBDIMM 10 (FIG. 1B) faces the second heat-dissipating sheet 20, and all the memory chips 120' on the back surface of the FBDIMM 10 attaches to the second heat-dissipating sheet 20. The purpose of attaching is for heat transmission that can be a directly contact or a non-directly contact wherein the difference between the directly contact and the non-directly contact rest with heat transmission medium, such as thermal adhesive, thermal grease or the combination thereof, whether need by or not.

Structurally, each of the first and second heat-dissipating sheets 30 and 20 is substantially rectangular and has two long edges (top and bottom edges) and two short edges. Flanges 320 and 220 are formed on the bottom edge of the first and second heat-dissipating sheets 30 and 20. In the assembly, the flanges 320 and 220 shield passive electrical components 140 and 140' to avoid damage during assembly process, wherein the passive electrical components 140 and 140' include capacitors, inductors, resistors, or combinations thereof (e.g. "0805 capacitors and inductors"). Furthermore, the passive electrical components 140 and 140' are located above the golden fingers 130 and 130' and arranged in lines on the front and back surfaces of the FBDIMM 10.

Bent portions 350 and 230 are formed on the short edges of the first and second heat-dissipating sheets 30 and 20 to hold FBDIMM 10, and are against the front surface and the back surface near the edges of the FBDIMM 10 respectively. When an external force is exerted on the first and second heat-dissipating sheets 30 and 20, not only the AMB chip 110 but also the FBDIMM 10 sustain the external force. Thus, the possibility of damage to the AMB chip 110 can be significantly reduced.

An opening 360 is provided on the bent portion 350 of the first heat-dissipating sheet 30, and a protrusion 240 is correspondingly provided on the bent portion 230 of the second heat-dissipating sheet 20. In the assembly, the protrusion 240 passes through a notch 150 on the side edge of the FBDIMM 10 into the opening 360. This kind of structure may promote assembly efficiency and accuracy, and prevent relative motion between the first and second heat-dissipating sheets 30 and 20.

It is understood that the locations of the protrusion 240 and the opening 360 can be exchanged. That is, the protrusion is provided on the bent portion 350 of the first heat-dissipating sheet 30, and the opening is correspondingly provided on the bent portion 230 of the second heat-dissipating sheet 20. Such an arrangement has the same function.

Figure 3:
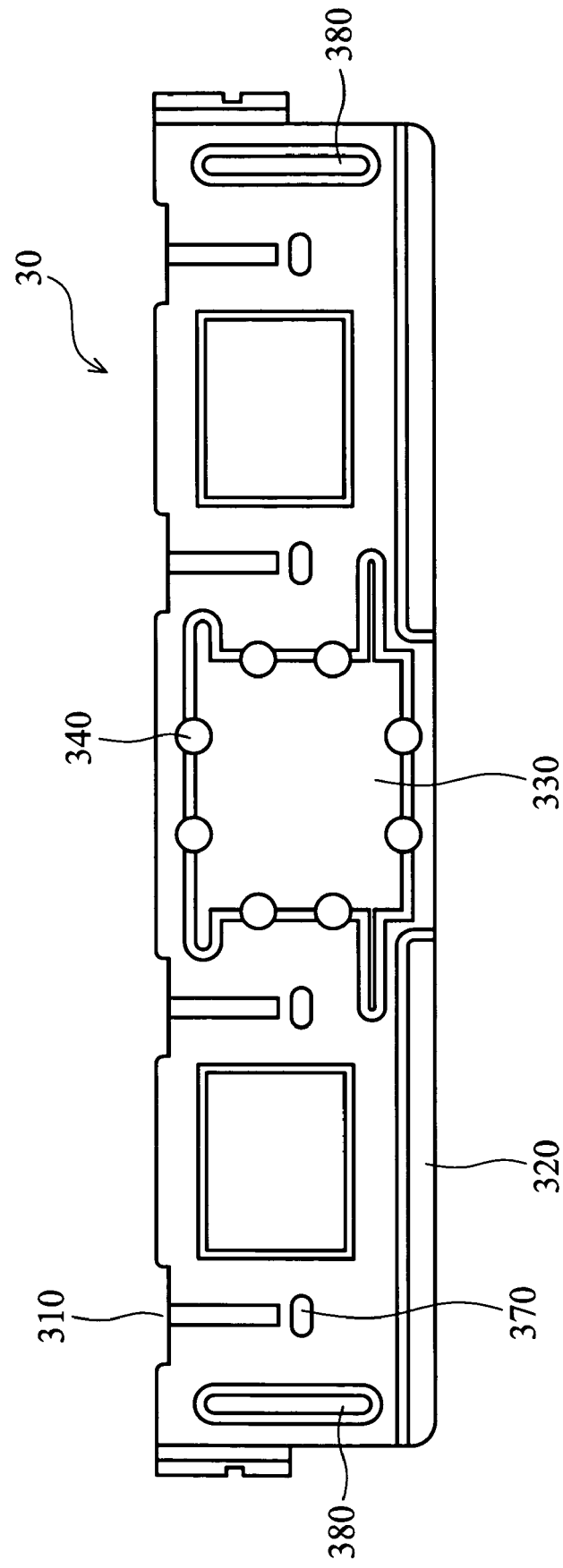
FIG. 3 is a schematic diagram of the first heat-dissipating sheet of FIG. 2, observed in direction A.

Please refer to FIG. 3. FIG. 3 is a schematic diagram of the first heat-dissipating sheet of FIG. 2, observed in direction A, wherein the first heat-dissipating sheet 30 has an embossed portion 330 of a predetermined height. In the assembly, the embossed portion 330 covers the AMB chip 110, and the back surface 330' of the embossed portion 330 attaches to the AMB chip 110. A plurality of heat-dissipating holes 340 is provided on the edges of the embossed portion 330 to enhance the heat-dissipating efficiency of the AMB chip 110.

Figure 4:
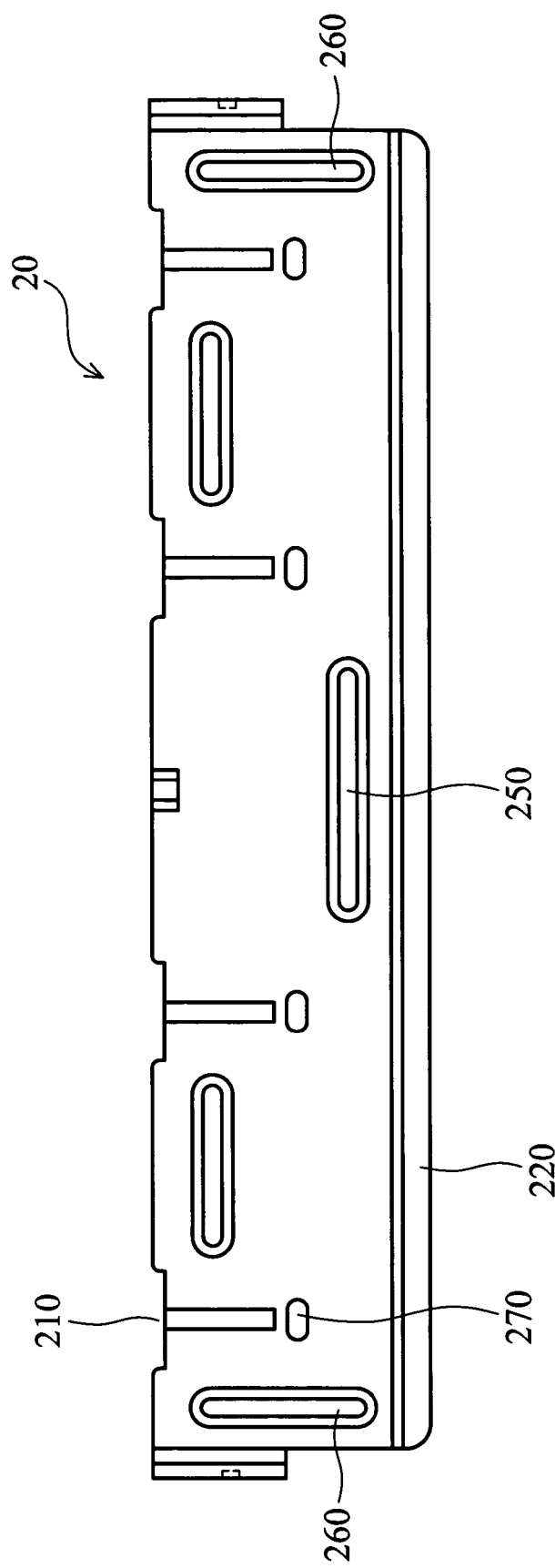
FIG. 4 is a schematic diagram of the second heat-dissipating sheet of FIG. 2, observed in direction B.
Figure 5B:
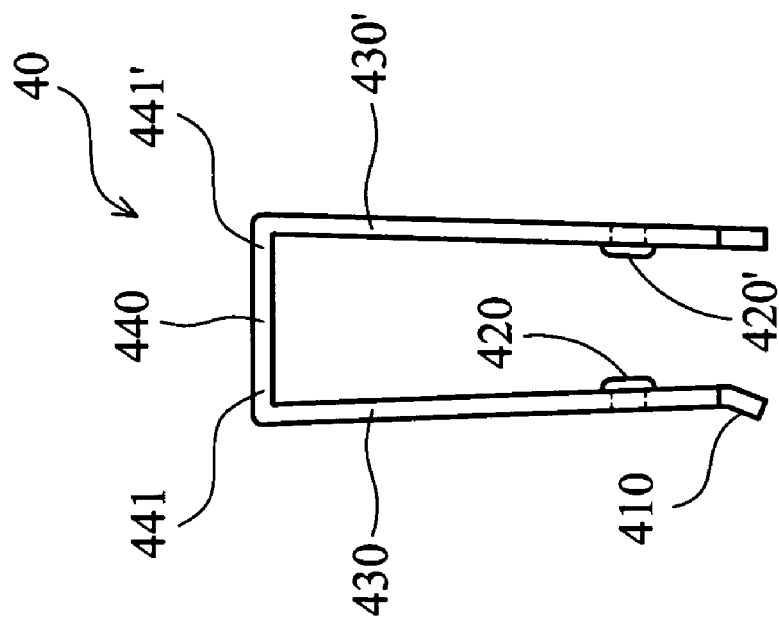
FIG. 5B is a side view of the clip of the heat sink assembly in accordance with the invention.
Figure 5A:
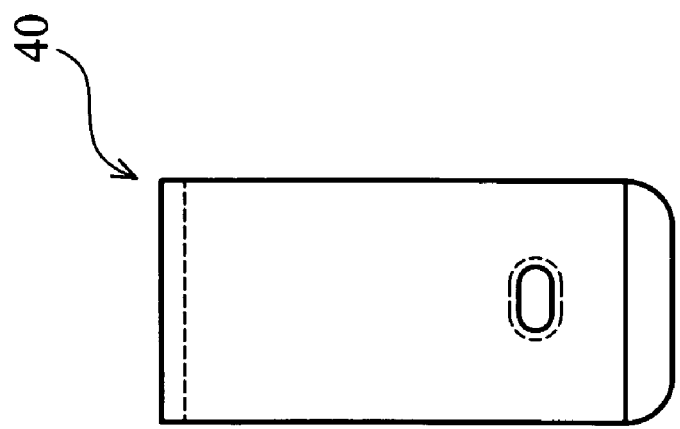
FIG. 5A is a front view of the clip of the heat sink assembly in accordance with the invention.

Please refer to FIGS. 3 and 4, wherein FIG. 4 is a schematic diagram of the second heat-dissipating sheet of FIG. 2, observed in direction B. A plurality of indentations 310 and 210 are formed on the top edge of the first and second heat-dissipating sheets 30 and 20. Holes 370 and 270 are provided under the indentations 310 and 210. Also referring to FIGS. 5A and 5B, the clip 40 has a first leg 430, a second leg 430', and a connecting portion 440 connecting the first and second legs 430 and 430'. The connecting portion 440 includes a first end 441 and a second end 441', wherein the first leg 430 extends from the first end 441 of the connecting portion 440, and the second leg 430' extends from the second end 441' of the connecting portion 440. Salient points 420 and 420' are formed on the inner surfaces of the first and second legs 420 and 420'. In the assembly, the connecting portion 440 of the clip 40 is disposed in the indentations 310 and 210 of the first and second heat-dissipating sheets 30 and 20. The salient points 420 and 420' of the clip 40 are respectively disposed in the holes 370 and 270 of the first and second heat-dissipating sheets 30 and 20. By such an arrangement, separation of the clips from the assembly is difficult.

Furthermore, in the assembly, the first and second legs 430 and 430' of the clip 40 hold against the first and second heat-dissipating sheets 30 and 20, respectively. The free end 410 of the first leg 430 is bended, facilitating removal of the clip 40 from the first and second heat-dissipating sheets 30 and 20. It is noted that the free end 410 of the first leg 430 is not higher than the height of embossed portion 330 of the first heat-dissipating sheet 30, while the clip 40 holds the first and second heat-dissipating sheets 30 and 20.

As shown in FIGS. 3 and 4, a plurality of embossed strips 380, 250, and 260 are formed on the first and second heat-dissipating sheets 30 and 20, and extend in different directions to enhance mechanical strength of the heat sink assembly in different directions. It is noted that the embossed strip 250 longitudinally extends along a lengthwise direction of the second heat-dissipating sheet 20, providing the heat sink assembly for sufficient mechanical strength to pass the three-point-bending test.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat sink assembly for dissipating heat from a fully buffered dual inline memory module which comprises an advanced memory buffer, a memory chip and a passive electrical component, the heat sink assembly comprising: a first heat-dissipating sheet; a second heat-dissipating sheet; and a clip detachably clamping the first heat-dissipating sheet and the second heat-dissipating sheet; wherein the fully buffered dual inline memory module is sandwiched between the first heat-dissipating sheet and the second heat-dissipating sheet and the first heat-dissipating sheet comprises an embossed portion connected to the advanced memory buffer and is spaced apart from the memory chip.

2. The heat sink assembly as claimed in claim 1, wherein the first heat-dissipating sheet and second heat-dissipating sheet both comprise a flange shielding the passive electrical component which comprises capacitor, inductor, resistor, or combinations thereof.

3. The heat sink assembly as claimed in claim 1, wherein the first heat-dissipating sheet comprises a first bent portion, the second heat-dissipating sheet comprises a second bent portion, and the first bent portion and the second bent portion are against the dual inline memory module respectively.

4. The heat sink assembly as claimed in claim 1, wherein the first heat-dissipating sheet is provided with an opening therein, the second heat-dissipating sheet comprises a protrusion, and the protrusion is inserted into the opening.

5. The heat sink assembly as claimed in claim 1, wherein a heat-dissipating hole is formed at an edge of the embossed portion.

6. The heat sink assembly as claimed in claim 1, wherein the clip comprises a first leg contacting the first heat-dissipating sheet, a second leg contacting the second heat-dissipating sheet, and a connecting portion connecting the first leg and the second leg.

7. The heat sink assembly as claimed in claim 6, wherein the first leg and the second leg clamp the heat sink assembly and a free end of the first leg is bended.

8. The heat sink assembly as claimed in claim 6, wherein the embossed portion is provided with an embossed height, and a height of the free end of the first leg is shorter than the embossed height.

9. The heat sink assembly as claimed in claim 6, wherein the first heat-dissipating sheet and the second heat-dissipating sheet comprise indentations respectively for engagement with the connecting portion.

10. The heat sink assembly as claimed in claim 6, wherein the second heat-dissipating sheet is substantially rectangular and provided with embossed strips formed thereon, wherein one of the embossed strips longitudinally extends along a lengthways of the second heat-dissipating sheet.

11. A heat sink assembly for dissipating heat from a device having a plurality of passive electrical components thereon, comprising:
   a first heat-dissipating sheet;
   a second heat-dissipating sheet; and
   a clip detachably clamping the first heat-dissipating sheet and the second heat-dissipating sheet;
   wherein the device is sandwiched between the first heat-dissipating sheet and the second heat-dissipating sheet, the first heat-dissipating sheet comprises an embossed portion, and the first heat-dissipating sheet further comprises a flange shielding the passive electrical components.

12. The heat sink assembly as claimed in claim 11, wherein the second heat-dissipating sheet comprises a flange shielding the passive electrical.

13. The heat sink assembly as claimed in claim 11, wherein the device comprises a dual inline memory module, the first heat-dissipating sheet comprises a first bent portion, the second heat-dissipating sheet comprises a second bent portion, and the first bent portion and the second bent portion are against the dual inline memory module respectively.

14. The heat sink assembly as claimed in claim 11, wherein the first heat-dissipating sheet is provided with an opening therein, the second heat-dissipating sheet comprises a protrusion, and the protrusion inserted into the opening.

15. The heat sink assembly as claimed in claim 11, wherein a heat-dissipating hole is formed at an edge of the embossed portion.

16. The heat sink assembly as claimed in claim 11, wherein the clip comprises a first leg contacting the first heat-dissipating sheet, a second leg contacting the second heat-dissipating sheet, and a connecting portion connects the first leg and the second leg.

17. The heat sink assembly as claimed in claim 16, wherein the first leg and the second leg clamp the heat sink assembly and a free end of the first leg is bended.

18. The heat sink assembly as claimed in claim 16, wherein the embossed portion is provided with an embossed height, and a height of the free end of the first leg is shorter than the embossed height.

19. The heat sink assembly as claimed in claim 16, wherein the first heat-dissipating sheet and the second heat-dissipating sheet comprise indentations respectively for engagement with the connecting portion.

20. The heat sink assembly as claimed in claim 16, wherein the second heat-dissipating sheet is substantially rectangular and provided with a plurality of embossed strips formed thereon and extending in different directions, and one of the embossed strips longitudinally extends along a lengthways of the second heat-dissipating sheet.

* * * * *